Figures 1, 2:
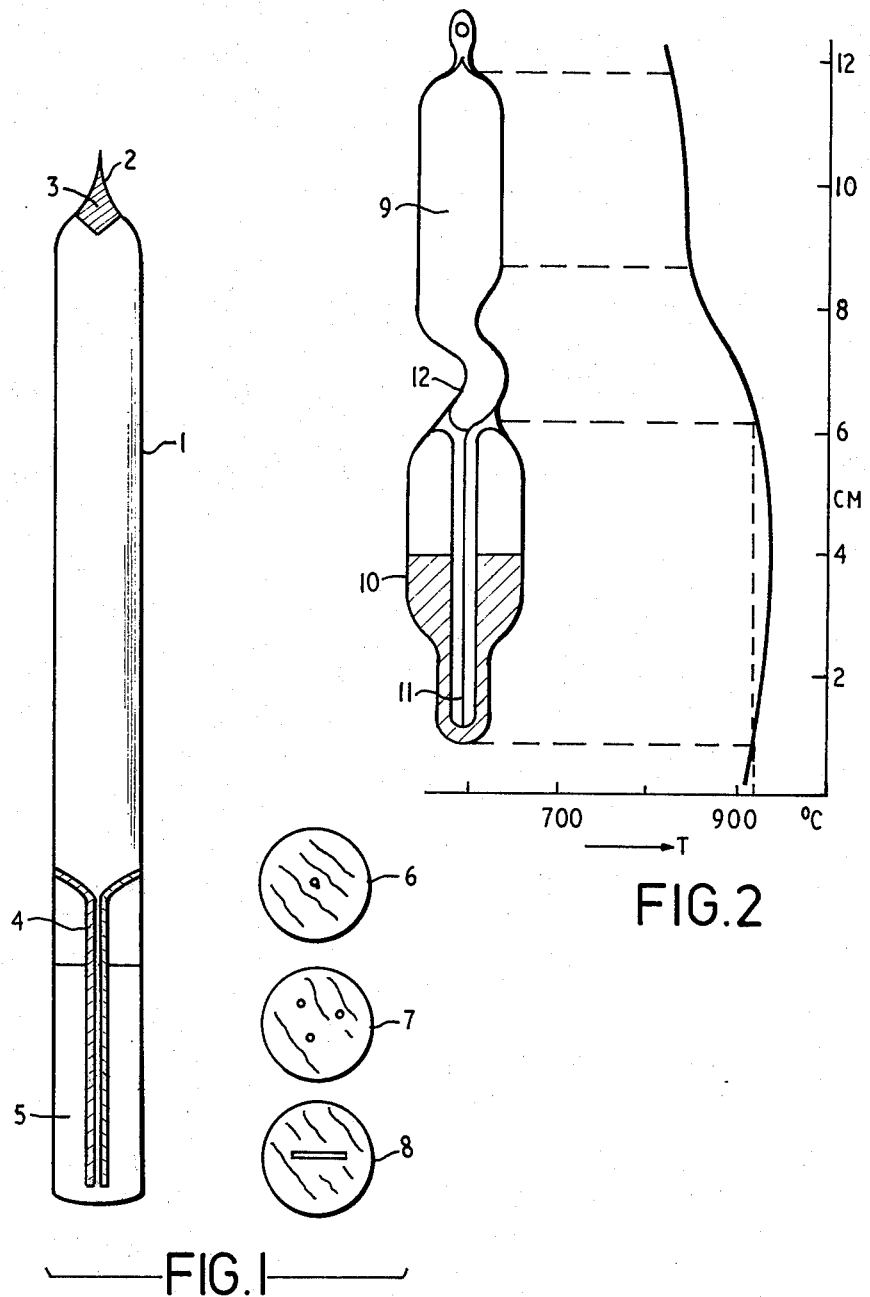

United States Patent [19]

Knittel

[11] 3,972,689
[45] Aug. 3, 1976

[54] METHOD FOR VAPOR GROWING CRYSTALS

[75] Inventor: Anthony Knittel, Kensington, Australia

[73] Assignee: Unisearch Limited, Australia

[22] Filed: Nov. 25, 1974

[21] Appl. No.: 527,069

[30] Foreign Application Priority Data
Nov. 28, 1973 Australia............................ 5797/73

[52] U.S. Cl. ............................ 23/294 R; 23/273 SP; 23/305 R; 156/611; 156/624; 423/89; 423/508
[51] Int. Cl.² ........................ B01D 9/02; B01J 17/30
[58] Field of Search............ 23/294, 301 R, 305 R, 23/305 RE, 264; 156/600, 603, 607, 608, 610, 611

[56] References Cited
UNITED STATES PATENTS

| | | | |
|---|---|---|---|
| 2,947,613 | 8/1960 | Reynolds et al. | 156/610 |
| 3,200,019 | 8/1965 | Scott, Jr. et al. | 23/294 |
| 3,231,337 | 1/1966 | Barkemeyer et al. | 23/294 X |
| 3,353,037 | 11/1967 | Jester et al. | 23/294 |
| 3,690,846 | 9/1972 | Akai et al. | 23/294 |
| 3,694,166 | 9/1972 | Kyle | 23/294 X |
| 3,704,103 | 11/1972 | Barta | 23/294 X |
| 3,725,008 | 4/1973 | Mikulyak | 23/294 |
| 3,796,545 | 3/1974 | Liner | 23/294 X |

*Primary Examiner*—Morris O. Wolk
*Assistant Examiner*—Barry I. Hollander
*Attorney, Agent, or Firm*—Richards, Harris and Medlock

[57] ABSTRACT

A method and a device for vapor growing crystals. The crystals are grown in an evacuated ampoule from a liquified sample source material, such that the source material is separated from the growing crystal by one or more capillaries or the like which provide the only pathway between the sample source and the growing crystal. There is a temperature gradient between the sample source and the growing crystal such that the growing crystal is at a lower temperature than the sample source.

6 Claims, 2 Drawing Figures

U.S. Patent  Aug. 3, 1976  3,972,689

METHOD FOR VAPOR GROWING CRYSTALS

The present invention relates to a method for vapour growing crystals of chalcogenides, alloys, multi-element crystals and lead salts such as Pb Te—Sn Te, Pb Se—Sn Se.

At present the highest quality crystals of the above mentioned types are obtained using the liquid epitaxial method of crystal growth which has the disadvantage that only thin crystals can be grown. Known methods of producing bulk crystals are the Czochralski, Bridgman and vapour techniques. The Czochralski and Bridgman techniques are essentially methods of growing crystals from the melt and, as with presently used methods of vapour growth, suffer from a lack of stoichiometric control. The vapour growth method of the present invention produces crystals of superior quality when compared with those grown by other methods and it also allows improved stoichiometric control.

Standard methods of crystal growth inside a sealed evacuated ampoule use solid source material, have a low crystal to source material temperature differential (often approximately 1°C) and there are no restrictions or conductance limiters on the path between the source material and the growing crystal.

According to the present invention crystals are vapour grown inside an evacuated ampoule the method being characterized in that a liquified sample source material is separated from the growing crystal by one or more conductance limiting and diffusion limiting channels which provide the only pathway between the sample source and the growing crystal and which extend into the liquid sample and in that there is a temperature gradient between the sample source and the growing crystal, the growing crystal being at a lower temperature than the sample source.

The conductance limiting channels can take many forms such as for instance a single capillary tube, several capillary tubes, or fine holes drilled through a plug, the cross-sectional shape of the tubes or holes being circular or any other shape. The total cross-sectional area of these channels depends on the size of the crystal to be formed. Typically a single capillary with a circular cross-section of diameter ½ mm will produce a crystal of 1 cm² cross-sectional area. It is found that if the cross-sectional area of the capillary is reduced better crystals are grown, however, the use of very small capillaries (e.g. less than 0.1 mm diameter if circular) results in very slow crystal growth.

With the method according to the invention temperature differences between the sample and the crystal of from a fraction of a degree to several hundreds of degrees are suitable. The preferred temperature difference is in the range 100°C to 200°C. for PbTe and SnTe for example.

When growing crystals using the method and apparatus according to the invention the growing process may be initiated with a small seed crystal.

The invention will now be further described with reference to the drawings in which:

FIG. 1 is a preferred form of ampoule adapted for vapour growing of crystals, and FIG. 2 is a modified ampoule which is deformed to provide a radiation screen. The furnace temperature profile suitable for PbTe crystals is also shown in FIG. 2.

Referring to FIG. 1 a tube 1 approximately 15 cm long is tapered at one end 2. A crystal 3 grows at this tapered end. A constricting channel 4 about 5 cm from the bottom of the tube and of ½ mm diameter extends fully into the liquified sample 5. A suitable temperature difference is maintained between the source material and the crystal, the temperature at the source being sufficient to maintain it in a liquid state and the gradient such that crystal formation is possible only in the portion of the tube above the constricting channels 6, 7 and 8 demonstrate some alternative constricting channel configurations in cross-section.

Crystal growers of dimensions many times larger or smaller than this preferred embodiment as described can be successfully used to grow crystals.

FIG. 2 shows another preferred form of the invention which has been found particularly useful for producing PbTe with room temperature carrier densities of $3 \times 10^{17} cm^{-3}$ as grown. The growth ampoule essentially consists of a sealed quartz tube which is partitioned into two sections as shown in FIG. 2. These two regions, referred to as growth region 9 and source reservoir 10, are interconnected by means of a fine bore capillary tube 11. Under growth conditions, the source material is maintained above the liquidus temperature and vaporization occurs within the capillary tube. A balance between the excess vapour pressure in the reservoir and the hydrostatic pressure from a liquid head in the capillary keeps the capillary filled automatically.

The furnace temperature profile suitable for PbTe crystals is also shown in FIG. 2. A temperature in excess of the liquidus point must be maintained over the entire source reservoir region. At the growth region, however, the temperature may be chosen to suit the experiment. For low growth temperatures a high temperature gradient must be established between the reservoir and growth regions. This has been satisfactorily achieved by surrounding the reservoir with an independent heater winding and this combination, together with insulation, is made to slide into a vertical furnace tube. The set furnace temperature is thereby close to the growth temperature and the insulated independent heater winding maintains the reservoir at the appropriate higher temperature. The direct thermal radiation reaching the growing crystal from the hotter reservoir is reduced by deforming the quartz ampoule tube into a radiation screen as shown at 12 in FIG. 2. It has also been found advantageous to coat all inside surfaces with graphite obtained from the thermal decomposition of acetone. The graphite reduces specular reflections of thermal radiation and also protects the quartz against chemical etching.

The ampoule is evacuated through a connection made to the source reservoir. Evacuation of the growth region, however, is then through the capillary and since this is an inefficient process, extensive heating and flushing with some inert gas is required. After the baking and evacuation, the reservoir is filled through the vaccum connection with crushed, reacted source material. A useful procedure has been the storage of the crushed material under vaccum in a pocket formed in a quartz tube which connects the ampoule to the diffusion pump. By fitting the above quartz tube with a rotating vaccum seal, it is then possible to dump the source material from the pocket into the reservoir just prior to sealing.

During the evaporation of the source material, the most volatile components are depleted from the melt-vapour interface region in the capillary. The spreading of this diffusive depletion process down the capillary is opposed by the replenishing flow of liquid. Eventually a steady state is reached in which the composition of the vapour produced corresponds to that of the source material, compared to the total growth time of the crystal, the time required by the vapour source to reach its steady state is obviously very short.

The equilibrium established between the growing crystal and vapour may also lead to inaccuracies of composition if the deviation from Raoults law is significant. The composition error is then proportional to the vapour volume in the growth ampoule which should be reduced to a minimum.

It will be appreciated by persons skilled in the art that numerous variations of the invention may be made within the broad scope of the invention described and that the embodiments of the invention described above are forms of the invention within its general scope.

What I claim is:

1. A method for vapour growing crystals inside an evacuated ampoule comprising separating a liquified sample source material from the growing crystal by at least one conductance limiting and diffusion limiting channel which provides the only pathway between the sample source and the growing crystal and which extends into the liquid sample and maintaining a temperature gradient between the sample source and the growing crystal so that the growing crystal is at a lower temperature than the sample source.

2. A method for vapour growing crystals as claimed in claim 1 wherein the conductance and diffusion limiting channel is in the form of at least one capillary tube.

3. A method for vapour growing crystals as claimed in claim 1 wherein the temperature gradient between the sample source and the growing crystal is in the range 100°C to 200°C.

4. A method for vapour growing crystals as claimed in claim 1 wherein the growing process is initiated with a small seed crystal.

5. A method for vapour growing crystals as claimed in claim 1 wherein the crystals grown are selected from the group consisting of PbTe and SnTe.

6. A method for vapour growing crytals as claimed in claim 1 wherein the conductance and diffusion limiting channel comprises at least one hole formed through a plug.

* * * * *